United States Patent [19]

Kuehnle

[11] 4,151,059
[45] Apr. 24, 1979

[54] METHOD AND APPARATUS FOR SPUTTERING MULTIPLE CYLINDERS SIMULTANEOUSLY

[75] Inventor: Manfred R. Kuehnle, Lexington, Mass.

[73] Assignee: Coulter Stork U.S.A., Inc., Chicago, Ill.

[21] Appl. No.: 864,375

[22] Filed: Dec. 27, 1977

[51] Int. Cl.² ............................................. C23C 15/00
[52] U.S. Cl. ................................ 204/192 R; 204/298
[58] Field of Search ........... 204/192 R, 192 C, 192 P, 204/298

[56] References Cited

U.S. PATENT DOCUMENTS

| | | | |
|---|---|---|---|
| 3,723,276 | 3/1973 | Lane et al. | 204/192 |
| 3,725,238 | 4/1973 | Fischbein et al. | 204/298 |
| 4,014,779 | 3/1977 | Kuehnle | 204/298 |

*Primary Examiner*—Aaron Weisstuch

*Attorney, Agent, or Firm*—Silverman, Cass & Singer, Ltd.

[57] ABSTRACT

Method and apparatus for sputter coating of printing or similar type cylinders by means of r.f. sputtering in which each of the cylinders being coated comprises a thin, metal sleeve of cylindrical configuration mounted on a mandrel. A plurality of mandrels is mounted in a sputtering chamber on a spider which is rotated coaxially with a cylindrical target, the target being stationary. A fixed ring gear cooperates with pinions on each of the mandrels to impart an epicyclic movement to the mandrels, each of which mounts a sleeve.

An r.f. sputtering condition is created in the chamber between the target and the cylinders so that a plurality of cylinders is coated simultaneously.

The chamber can be opened to remove the cylinders after sputtering to replace them with others to be coated, this without disturbing the target.

8 Claims, 6 Drawing Figures

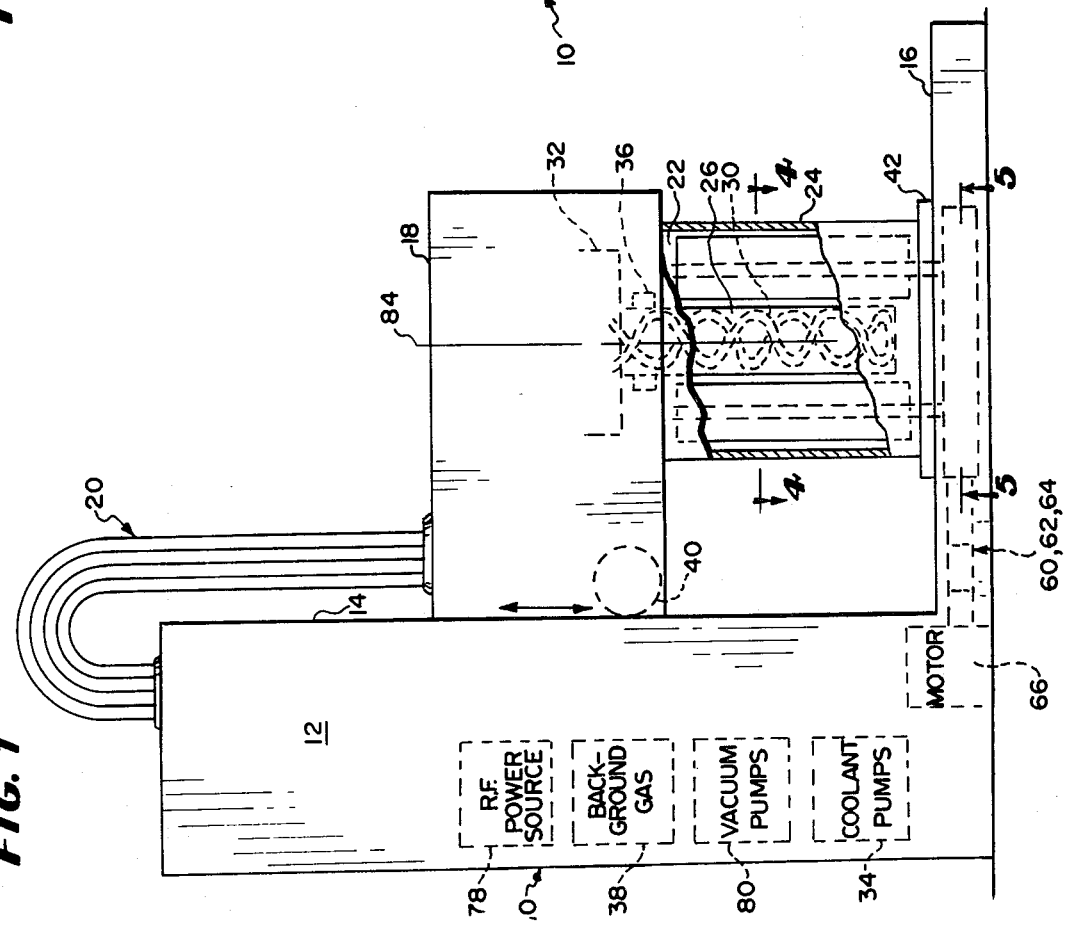

METHOD AND APPARATUS FOR SPUTTERING MULTIPLE CYLINDERS SIMULTANEOUSLY

FIELD OF THE INVENTION

The general field of the invention comprises sputtering apparatus and more particularly the invention is concerned with apparatus for sputtering a photoconductive or similar coating onto a plurality of cylinders simultaneously whereby to achieve a plurality of seamless members each comprising a continuous substrate having a coating on its surface, the coating having uniformity in all respects, i.e., physical, chemical, crystallographic and electrical.

BACKGROUND OF THE INVENTION

Sputtering apparatus has been known for a considerable period of time for use in sputtering metals and in some instances insulators onto substrate members of relatively small size. Only in recent times has the technique been extended to the sputtering of photoconductive materials. Likewise it is only in recent times that the type of apparatus has been evolved which enables sputtering of large quantities of material for production purposes. For example, sputtering of electrophotographic film which is a meter or more in width and several hundred meters long is a practical achievement through the use of the sputtering methods and apparatus disclosed in U.S. Pat. Nos. 3,829,373; 3,884,787; 3,905,887; 4,013,539 and 4,026,787.

Sputtering generally comprises the deposition of material by establishing an electrical plasma condition in a pressure vessel between a target or cathode of the material which is to be deposited and an anode upon which the material is to be deposited. A high energy r.f. power source is coupled to the target and anode and an inert gas of high atomic weight such as argon is introduced into a low pressure chamber which houses the target and the anode so that the argon will be ionized and the heavy ions bombard the target. This literally drives particles of the target material out of the target into the gap between the target and anode, these particles being molecules of the target material, the established field or fields between the two electrodes causing the particles to be driven to the anode and deposited thereon. A substrate member of some material, which can be metal or an insulator such as polyester, overlying the anode will alternately receive the sputtered particles as a deposit. This deposit can be built up to thicknesses which depend upon the conditions within the chamber, the materials involved, the time of sputtering and other parameters such as power, temperature, gas pressure, etc.

The particular kind of apparatus which is discussed in the above mentioned patents is especially intended for the deposit of a crystalline coating of a photoconductive material of cadmium sulfide or the like having unusual properties. The material itself and the special conditions of its manufacture are disclosed in the U.S. Pat. No. 4,025,339.

This invention is especially concerned with the deposition of this type of crystalline photoconductive material upon cylindrical substrates for use in different kinds of imaging apparatus, for example, convenience or office copiers, printing plate makers, printing presses and the like.

In the course of sputtering photoconductive materials of the type described and claimed in said U.S. Pat. No. 4,025,339 it has been found that the nature of the background gas and the manner of introducing the same relative to the targets is important. This is preferably effected through the use of apparatus of the type disclosed in U.S. Pat. No. 3,976,555. Another very important requirement in achieving the desired properties of the deposit is that the voltage on the anode must be different from ground. A.C. or D.C. bias may be supplied directly or indirectly. In the case of production apparatus, large rolls of polyester are designed to be coated by passing them over a rotary drum which comprises the anode. This drum must thus be insulated from the shielding in the chamber, must itself be shielded and must be properly mounted for rotation upon the framework of the apparatus. When this voltage difference exists there is a second dark space adjacent the anode that produces the desired results.

The problems of having the drum surface comprising the anode at a different potential than the shielding and walls of the chamber, which are at ground potential, are solved in one manner in the apparatus which has been described above by the expedients described in U.S. Pat. No. 4,014,779.

In a copending application Ser. No. 864,378, filed Dec. 27, 1977 the problem of providing apparatus for making a cylinder which has an outer coating of the photoconductive material upon a substrate which may be insulating or metallic is basically attacked. The various requirements are reviewed and are solved by the invention as disclosed and claimed therein. For example, the problem of a seamless deposit as opposed to a deposit on an elongate sheet is solved by mounting the substrate cylinder in the center of an array of targets arranged to define a second cylinder of larger diameter. The normal requirements of establishing a second dark space, providing the background gas, cooling the cathode, heating the anode, etc. are all solved. Methods of easily installing and removing the sputtered cylinders are disclosed.

The principal use for the invention herein is in connection with a special type of cylinder mentioned in said copending application, but as in said application, the invention herein is not limited to apparatus for making such special type of cylinders.

For a complete understanding of the invention herein, the said cylinder is described hereinafter.

The printing cylinders which are to be made by the invention herein are based upon thin-walled metal cylinders of nickel or copper plated nickel or similar stable metal of the type described in U.S. Pat. Nos. 2,287,122 and 3,354,519. The cylindrical substrates are imperforate and made by electroplating or electroforming with a wall thickness a small fraction of a millimeter, a length of about two meters and a diameter of about a sixth of a meter. These cylinders are quite flexible and readily collapse, and yet, in order to be used for high quality printing they must have a uniform photoconductive coating; hence they must be fully supported or extended during sputtering to prevent non-uniformity of deposit.

In the copending application, means are disclosed for supporting the flexible metal cylinder on a mandrel to keep it in geometrically cylindrical form while being sputtered so that the resulting coating is uniform in all respects. This is accomplished by means which grip or extend the sleeve on the mandrel and maintain this disposition during the sputtering action. The mandrel is readily removed and installed in the sputtering apparatus. In this application it should be understood that the cylinders can be of sufficient rigidity that they can be self-supporting and readily secured to the mandrels without difficulty. It should be emphasized, however, that the structures of the copending application can be utilized to mount collapsible cylindrical substrates upon the mandrels and this invention is especially intended for coating the latter type of substrates.

Also, the removability of the mandrels is not described in detail because that can be effected by disassembling the structures disclosed herein or by using the teachings of the copending application.

Although not specifically detailed herein, all of the conditions required for proper sputtering of the photoconductive material in accordance with the teachings of U.S. Pat. No. 4,025,339 must be provided for and will be presumed even though they may not be illustrated and described herein in great detail.

One of the difficulties with the sputtering of seamless sleeves is that where the target configuration is intended to conform to the shape of the sleeve, the disposition of target and anode must necessarily be on a one-to-one basis—that is, a single array of targets arranged in a cylindrical configuration can coat only a single cylindrical sleeve. Thus, for each sleeve coated there has to be an installation and removal. Sputtering is a complex system and requires considerable preliminary preparation. For example, the chamber must be pumped down prior to use and all of the parameters adjusted for steady state before the sputtering can commence. All of this takes time. If one has to open and close the chamber and make all of the adjustments each time that a single cylinder is to be sputtered, the time and money expended would make the production of a large number of such cylinders uneconomical.

Accordingly, the invention has solved the problem by providing structure to mount a plurality of cylinders for simultaneous sputtering so that each time that the chamber is opened and closed one time a plurality of cylinders will be provided. The resulting economy is obvious.

SUMMARY OF THE INVENTION

Apparatus for sputtering a plurality of cylinders simultaneously comprises a sputtering chamber, means mounting a cylindrical target therein and structure for connecting the target as a cathode in r.f. sputtering technique. A carrier for a plurality of mandrels is provided, each mandrel adapted to removably mount a cylinder which is to be sputtered by the target. Each mandrel and cylinder is mounted on an axis parallel to the axis of the target, the mandrel axes lying on a cylinder whose diameter is greater than the diameter of the target and coaxial therewith.

The mandrel carrier is rotated while the mandrels are driven epicyclically and the target is fixed. Means are provided to establish an r.f. plasma belt adjacent the target and the cylinders are mounted so that their respective surfaces which face the target are passing through a portion of the plasma belt. The cylinders are connected into the circuit of the sputtering apparatus in such a manner as to provide an effective bias thereon, hence they are not grounded.

The sputtering apparatus is arranged to enable the chamber to be opened, exposing the cylinders for ready removal and installation. The sputtering target is connected to the r.f. power supply and has heat exchange liquids circulating therein, if required.

BRIEF DESCRIPTION OF THE DRAWINGS

FIG. 1 is a side elevational view, more or less diagrammatic, with portions broken away, illustrating one form of the invention, the same being shown in a closed condition while the sputtering process is being carried out;

FIG. 2 is a similar view but illustrating the vessel of the apparatus open to expose the mounted cylinders;

DESCRIPTION OF THE PREFERRED EMBODIMENTS

Figure 3:
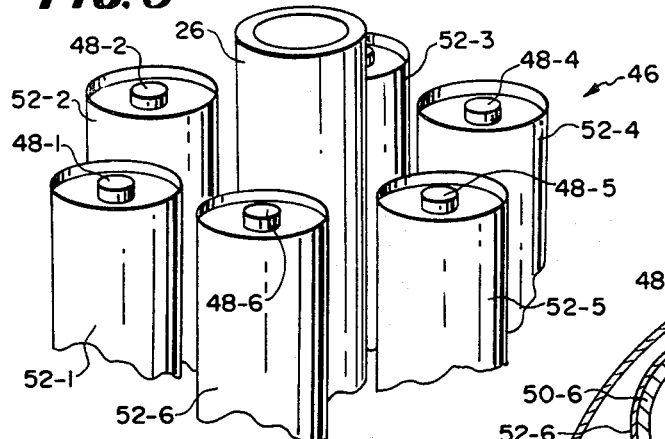
FIG. 3 is a fragmentary perspective diagram to show the arrangement of the target cylinder and the cylinders being coated.

The invention generally comprises means for mounting a plurality of cylinders to be sputtered on a carrier which is rotated at the same time that the respective cylinders are individually rotated on their axes so that they describe what may be termed an epicyclical movement. The cylinders rotate on axes which define a circle that is coaxial with a fixed cylindrical target. In this way the target can cooperate with all of the cylinders simultaneously and establish its sputtering plasma between itself and them. The cylinders are all connected into the sputtering circuit.

Preferably the structure is arranged so that the vessel which defines the sputtering chamber can be lifted along with the target and thereby expose the cylinders so that they can be removed after sputtering and new ones installed.

The cylinders would be normally mounted on mandrels which are arranged for the epicyclical movement.

In FIG. 1 there is illustrated a sputtering apparatus 10 which is connected to suitable power sources and has the several required supplies needed for operating a sputtering apparatus. For example, symbolic blocks 78, 38, 80 and 34 represent, respectively, r.f. power source, background gas, vacuum pumps and coolant pumps. Many measuring instruments, controls and the like are also associated with the apparatus 10. There is illustrated a fixed standard 12 having a track 14, a support base 16 and a carriage 18 which is arranged to be moved along the track 14 vertically. There is an assembly of flexible cables and conduits 20 which couple the carriage and the standard 12 so that all of the required systems of the apparatus can be utilized in the sputtering chamber. Movement of the carriage flexes the assembly 20.

The sputtering chamber 22 is formed within the cylindrical vessel 24 that is preferably of steel and is grounded and depends from the underside of the carriage 18. Coaxial with the vessel 24 is a target 26 in the form of a cylinder, being formed of the material which is to be sputtered, for example pure cadmium sulfide, doped or undoped. The target is mounted on a suitable base such as for example a cylindrical form 28 (FIG. 4) of stainless steel which may be cooled by heat exchange liquid carried in pipes or manifolds formed on the interior of the form 28. These are indicated in the broken lines 30 in FIG. 1 connecting with a suitable sump 32 or the like which connects with the pumps 34. In operation, the surface of the target 26 will be bathed in the background gas which could be admitted into the chamber 22 in any suitable or convenient manner such as for example by the collar-like header 36 including nozzles directed downward and being connected to the background gas source 38.

Since the carriage 18 is moved vertically, as for example by a suitable drive motor and connecting gearing indicated generally at 40, the target 26 will move with the carriage 18 when the latter is moved. In FIG. 2 the carriage 18 is shown in raised condition, carrying the vessel 24 and the target 26 upward with itself. The bottom end of the vessel 24 has an annular flange 42 that cooperates with a suitable gasket 44 mounted to the base 16 to seal the vessel 24 in place when it is engaged against the said base.

Figure 4:
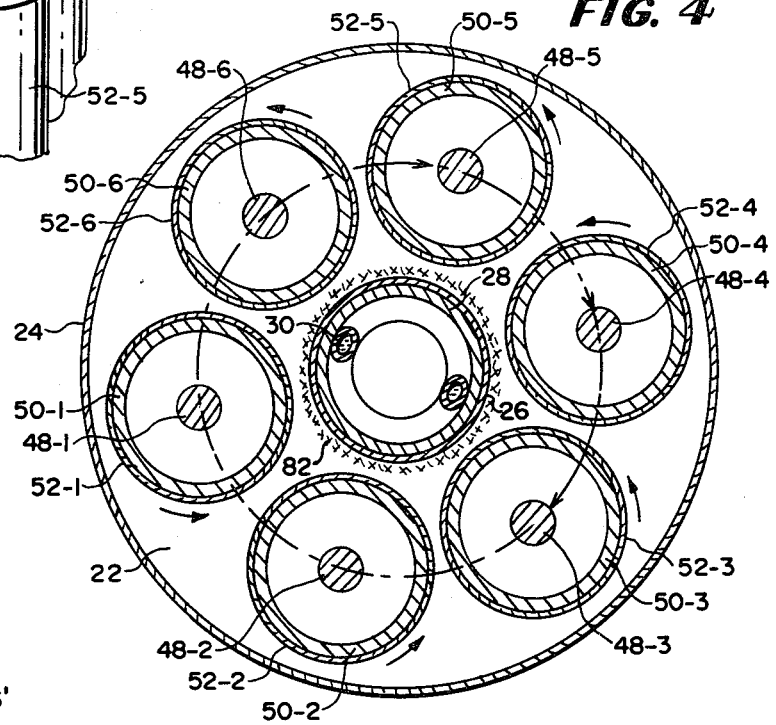
FIG. 4 is a fragmentary sectional view taken generally along the line 4—4 of FIG. 1 and looking downward.
Figure 5:
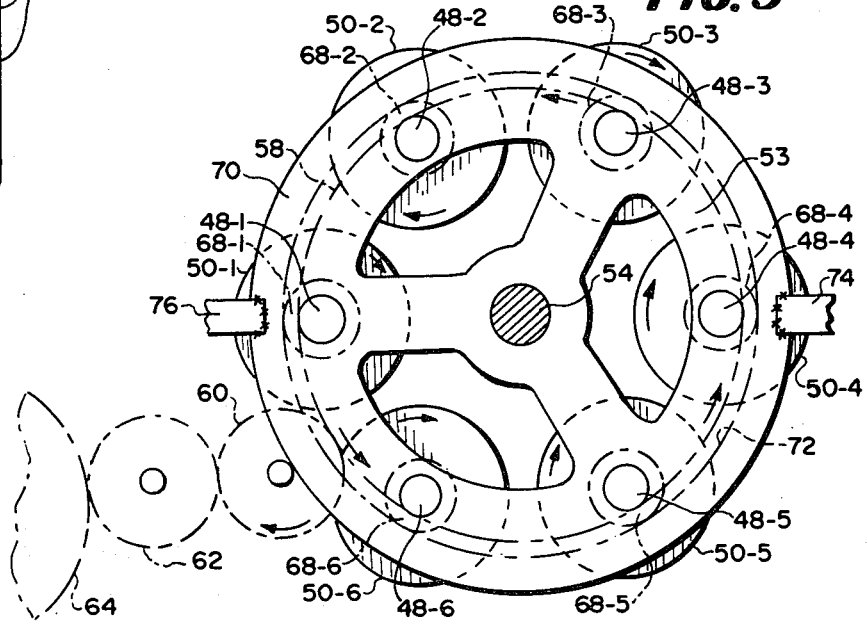
FIG. 5 is a fragmentary sectional view taken generally along the line 5—5 of FIG. 1 and looking upward.

As shown in FIGS. 3–5, there is an assembly of mandrels designated generally by the reference character 46, each including a shaft 48-1 to 48-6 respectively connected with the mandrels 50-1 to 50-6. Each mandrel may be constructed in any suitable manner to enable it readily to be secured to or removed from the spider 53 mounted in the base 16 on a shaft 54 that is coaxial with the target 26. The mandrels 50-1 to 50-6 are spaced circumferentially around the spider 53 so that they define a generally cylindrical arrangement that is coaxial with and surrounds the target 26 when the chamber 22 is closed.

Each mandrel is required to mount a cylindrical substrate upon which the material of the target 26 is to be sputtered. In the disclosure herein, the intended result is a very thin cylinder of metal having a coating of microcrystalline cadmium sulfide in accordance with the patents mentioned previously. Thus, there is a very thin sleeve of metal mounted on each of the mandrels, such sleeves being illustrated at 52-1 to 52-6. The thickness in the views is exaggerated since the sleeve walls are very thin compared to the thickness of a support mandrel wall, for example. It should be appreciated that if the mandrel has only end discs and interconnecting shaft means and the ends of the thin walled cylinder are clamped or otherwise affixed to these discs, there may be no intervening support needed for the substrate. The sectional parts shown at 50-1 to 50-6 in FIG. 4 would then be in plan representing the inner ends of the discs.

Adverting now to the spider 53, its outer edge is provided with gear teeth that face outwardly as indicated by the dot-dash circle line 58. These gear teeth 58 are connected with a spur gear 60 that is driven through a suitable drive train including for example the gears 62 and 64 and a motor 66 (FIG. 1). If the spur gear 60 rotates in a clockwise direction (FIG. 5) the entire spider 53 will rotate in a counterclockwise direction as indicated by the arrows in FIG. 5, carrying all of the shafts 48-1 to 48-6 with it.

Each shaft 48-1 to 48-6 has a pinion gear affixed to it above the spider 53 and axially spaced from the location of the gear teeth 58, these pinion gears being designated 68-1 to 68-6, respectively. Again, as in the case of the gears 60, 62 and 64 and the gear teeth 58, the gear teeth of the pinion gears 68-1 to 68-6 are represented by dot-dash circle lines. There is a large ring gear 70 that has interior gear teeth as indicated by the dot-dash circle line 72, the ring gear 70 being fixed in the base 16 as indicated symbolically by the connecting tie-down brackets 74 and 76. The interior teeth 72 are in meshed engagement with the teeth of the pinion gears 68-1 to 68-6.

It will be clear then, that as the spider 53 rotates in a counterclockwise direction as indicated by the arrows in FIG. 5, the individual mandrels 50-1 to 50-6 and their respective sleeve substrate members 52-1 to 52-6 will rotate in a clockwise direction as indicated by the arrows in FIG. 5. Since the sectional view of FIG. 4 is looking downward instead of upward, for the same direction of rotation of the gear 60, the cylinders including the mandrels and substrate sleeves will be rotating in a counterclockwise direction.

When the chamber 22 is enclosed and the vessel 24 is sealed in its lower position as shown in FIG. 1, the sputtering operation can be carried out. The r.f. power supply 78 furnishes the electrical power to the apparatus, the cathode or target 26 being at a very high negative voltage (considering diode action), say of the order of 2500 volts d.c. The substrate sleeves or cylinders 52-1 to 52-6 comprise anodes and according to the techniques of the patents mentioned are required to be connected into the circuit in such a manner that there is a second dark space adjacent their surfaces. This can be done by connecting them to the r.f. power supply through a suitable voltage divider giving a very low d.c. voltage of the order of 20 volts at the anodes or by using a d.c. bias circuit to achieve the same voltage or by connecting them in such a manner that they float electrically. In any case, these cylinders or anodes must be insulated from ground and the details of construction needed for this purpose are described in the patents which are mentioned and in the copending application above referred to.

When the system is started the chamber 22 is evacuated by the pumps 80 and the gas admitted. The plasma which results from the sputtering technique appears surrounding the cathode 26 and between it and the sleeve members at a distance of between 1 and 3 centimeters. This plasma is shown at 82 in FIG. 4 in crosshatching. A substantial portion of each cylinder 52-1 to 52-6 passes through the plasma as the apparatus is operating and the cylinders are rotating. In this manner there is a continuous and even deposit of the material of the cathode 26 on each of the cylinders, this occurring simultaneously. When the process is completed, all of the cylinders are removed and new ones installed and the process repeated.

Several items of interest should be pointed out. In the possibility that the target surface may have non-uniform areas which would result in an uneven or non-uniform deposit it is feasible to reciprocate the target 26 axially while the assembly 46 is rotating around it or the entire assembly 46 could be reciprocated axially. Likewise, the target surface could be shifted often, say between runs. A reciprocating motor 88 is shown in FIG. 2.

Figure 6:
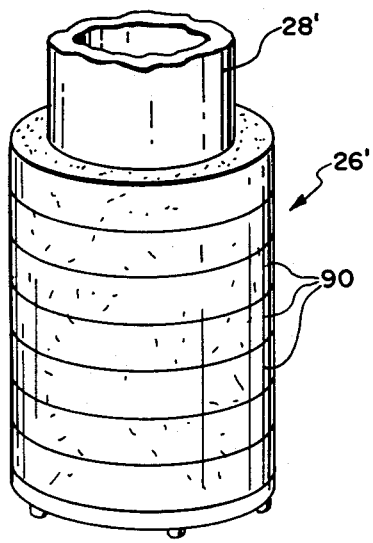
FIG. 6 is a fragmentary perspective view of a modified form of target.

The target 26 could be formed of plates or plaques which are cemented on the base 28, these being laid on in a mosaic arrangement of small or large pieces, either arcuate or flat. One very convenient and economical method of making the target 26 is to form the same out of rings of the photo-conductive material which are stacked onto a cylindrical base. These are relatively easy to make, easy to mount and replace. Cadmium sulfide targets sometimes have a tendency to pit and blow out at tiny spots which overheat. If made of rings, the target would be simple to repair in short order. A view of such a target 26' is shown in FIG. 6, made out of annular rings 90 of sintered photoconductive material.

Shielding either the target or the cylinders or the anodes is a simple matter because in fact there is no metal exposed which is not covered either by the target material or the substrate material except at the ends of target and cylinders. The space between anodes is very small and will pass little if any of the plasma, and even then, most of the plasma will be exhausted by the time the inner wall of the vessel 24 is reached by flying molecules of the sputtered material. It will practically all have been deposited on the surfaces of the anodes. If shielding is needed, it is a simple matter to provide the same.

Variations of the apparatus are readily pointed out.

Instead of the apparatus being arranged so that the movement of the carriage is vertical, it could be horizontal. Then the axial disposition of the elements described as indicated at 84 will be horizontal instead of vertical. Vertical disposition is preferred because debris from target pits does not fall on the anodes.

Instead of the target 26 moving with the carriage 18 it could be connected to the base 16 and having its systems operating through suitable channels and conduits in the base. Then the vessel 24 would be the only part that is moved upward.

The anodes/mandrels could be mounted on the carriage 18 either with or without the vessel and the target 26 mounted on the base 16. Thus, the means for driving the mandrels epicyclically would be in the carriage.

Instead of the target 26 and vessel 24 moving upward, the assembly 46 could be raised out of the vessel 24, leaving also the target 26 connected to the base 16. Thus, the cylinders would be raised and exposed and could readily be removed and replaced.

Although six cylinders 52-1 to 52-6 are shown comprising the assembly 46, the number could be more or less than six.

Other variations are feasible within the scope of the invention as defined in the accompanying claims.

What it is desired to secure by Letters Patent of the United States is:

I claim:

1. Apparatus for sputtering a photoconductive coating onto a plurality of sleeves of substrate material simultaneously which comprises:
   A. a sputtering vessel having a sputtering chamber and means for establishing an r.f. plasma belt in the chamber including centrally disposed target means adapted to be of material corresponding to said photoconductive coating and defining a cylindrical surface and an assembly of a plurality of spaced anodes arranged in the chamber annularly of said target means, each anode being spaced from the target means and the distance being such that the plasma belt engages each of the anodes on the surface thereof,
   B. each anode being generally cylindrical and the axis of each being parallel to the axis of the target means, all of the anode axes being arranged in a circle and defining a cylinder whose diameter is greater than that of the target means and which is coaxial with the target means,
   C. means for mounting and driving the anodes in an epicyclical movement around the target means axis so that the surfaces of the anodes rotate through the plasma belt to deposit a continuous, seamless and substantially uniform sleeve of said photoconductive material onto all of said anodes simultaneously, and
   D. each anode including a mandrel having means for mounting a sleeve of substrate material onto the mandrel to constitute said anode and receive the coating thereon.

2. The apparatus as claimed in claim 1 in which the chamber is formed by a vessel which is adapted to enclose the target means and anodes during the sputtering operation, the apparatus including means for moving the vessel relative to the anodes to expose all of the anodes to enable their removal.

3. The apparatus as claimed in claim 2 in which the vessel is moved vertically.

4. The apparatus as claimed in claim 1 in which the apparatus includes a movable carriage, there is a sealing seat on a non-movable part of the apparatus, there is a normally open ended vessel having means on said open end cooperating with said sealing seat, the carriage carries the vessel and target means, the anodes are mounted to the non-movable part within the sealing seat, the target means and anodes being arranged opposite one another for sputtering when the carriage is located in one position sealing the vessel to said seat, and the anodes being fully exposed when the carriage is located in a second position spacing the vessel from the seat and carrying the vessel and target means away from the non-movable part.

5. The apparatus as claimed in claim 4 in which means are provided for moving the carriage vertically.

6. The apparatus as claimed in claim 1 in which means are provided for reciprocating the target means axially while the anodes are being so driven.

7. The apparatus as claimed in claim 1 in which the means for mounting and driving the anodes comprise a carrier mounted for rotation coaxially with said target means, each anode being mounted on its axis to said carrier rotatively and having a pinion gear, a fixed ring gear engaging all of the pinion gears and means for rotating the carrier without rotating the ring gear.

8. A method of sputtering which includes establishing a sputtering r.f. plasma between a fixed target and a plurality of anodes within a sputtering chamber and providing suitable conditions within the chamber to effect the sputtering of the material of the target onto the anode which comprises,
   arranging the anodes in a circle around the target to establish plasma between target and all anodes simultaneously and moving the anodes in an epicyclical movement around said target while the plasma is established to deposit the target material on all sides of the anodes.

* * * * *